US008217867B2

(12) United States Patent
Hamer et al.

(10) Patent No.: US 8,217,867 B2
(45) **Date of Patent: *Jul. 10, 2012**

(54) COMPENSATION SCHEME FOR MULTI-COLOR ELECTROLUMINESCENT DISPLAY

(75) Inventors: John W. Hamer, Rochester, NY (US); Dustin L. Winters, Webster, NY (US); Charles I. Levey, West Henrietta, NY (US)

(73) Assignee: Global OLED Technology LLC, Herndon, VA (US)

( * ) Notice: Subject to any disclaimer, the term of this patent is extended or adjusted under 35 U.S.C. 154(b) by 1055 days.

This patent is subject to a terminal disclaimer.

(21) Appl. No.: 12/128,697

(22) Filed: May 29, 2008

(65) Prior Publication Data

US 2009/0295422 A1 Dec. 3, 2009

(51) Int. Cl.
*G01R 31/26* (2006.01)

(52) U.S. Cl. ............................ 345/82; 345/76; 324/769

(58) Field of Classification Search ............... 345/76–82
See application file for complete search history.

(56) References Cited

U.S. PATENT DOCUMENTS

| | | | |
|---|---|---|---|
| 6,359,398 | B1 | 3/2002 | Nakajima et al. |
| 6,369,851 | B1 | 4/2002 | Marflak et al. |
| 6,433,488 | B1 | 8/2002 | Bu |
| 6,771,028 | B1 * | 8/2004 | Winters ..................... 315/169.1 |
| 6,856,328 | B2 | 2/2005 | Holtslag |
| 6,894,283 | B1 * | 5/2005 | Busse et al. .............. 250/370.09 |
| 6,995,519 | B2 | 2/2006 | Arnold et al. |
| 7,038,668 | B2 | 5/2006 | Kota et al. |
| 2004/0100430 | A1 | 5/2004 | Fruehauf |
| 2005/0093796 | A1 * | 5/2005 | Fergason ........................ 345/88 |
| 2005/0180083 | A1 | 8/2005 | Takahara et al. |
| 2005/0204313 | A1 | 9/2005 | Enoki et al. |
| 2005/0269959 | A1 | 12/2005 | Uchino et al. |
| 2007/0195020 | A1 | 8/2007 | Nathan et al. |
| 2008/0231562 | A1 * | 9/2008 | Kwon ............................ 345/77 |

(Continued)

FOREIGN PATENT DOCUMENTS

CA 2 576 811 A1 5/2007

(Continued)

OTHER PUBLICATIONS

International Search Report and Written Opinion of the International Searching Authority from the PCT dated Nov. 30, 2010.

(Continued)

*Primary Examiner* — Alexander S Beck
*Assistant Examiner* — Amen Bogale
(74) *Attorney, Agent, or Firm* — Morgan, Lewis & Bockius LLP

(57) ABSTRACT

A method of compensating for changes in the characteristics of transistors and electroluminescent devices in an electroluminescent display, includes: providing an electroluminescent display having a two-dimensional array of subpixels arranged forming each pixel having at least three subpixels of different colors, with each having an electroluminescent device and a drive transistor, wherein each electroluminescent device is driven by the corresponding drive transistor; providing in each pixel a readout circuit for one of the subpixels of a specific color having a first readout transistor and a second readout transistor connected in series; using the readout circuit to derive a correction signal based on the characteristics of at least one of the transistors in the specific color subpixel, or the electroluminescent device in the specific color subpixel, or both; and using the correction signal to adjust the drive signals.

12 Claims, 5 Drawing Sheets

U.S. PATENT DOCUMENTS

| | | | | |
|---|---|---|---|---|
| 2009/0174628 A1* | 7/2009 | Wang et al. | ..................... | 345/76 |

FOREIGN PATENT DOCUMENTS

| | | | |
|---|---|---|---|
| EP | 1 381 019 | A1 | 1/2004 |
| EP | 1 489 589 | A1 | 12/2004 |
| GB | 2 441 354 | A | 3/2008 |
| JP | 2005-037843 | | 10/2005 |
| WO | WO2005/109389 | A1 | 11/2005 |

OTHER PUBLICATIONS

Jahinuzzaman et al, Threshold voltage instability of amorphous silicon thin-film transistors under constant current stress, Applied Physics Letters 87, 023502 (2005).

* cited by examiner

COMPENSATION SCHEME FOR MULTI-COLOR ELECTROLUMINESCENT DISPLAY

CROSS REFERENCE TO RELATED APPLICATIONS

Reference is made to commonly assigned U.S. patent application Ser. No. 11/766,823 filed Jun. 22, 2007, entitled "OLED Display with Aging and Efficiency Compensation" by Levey et al.; U.S. patent application Ser. No. 11/946,392 filed Nov. 28, 2007, entitled "Electroluminescent Display with Interleaved 3T1C" by White et al.; and U.S. patent application Ser. No. 12/128,720 filed concurrently herewith entitled "Compensation Scheme for Multi-Color Electroluminescent Display" by Charles I. Levey the disclosures of which are incorporated herein by reference.

FIELD OF THE INVENTION

The present invention relates to solid-state OLED flat-panel displays and more particularly to such displays having means to compensate for the aging of the organic light emitting display components.

BACKGROUND OF THE INVENTION

Electroluminescent (EL) devices are a promising technology for flat-panel displays. For example, Organic Light Emitting Diodes (OLEDs) have been known for some years and have been recently used in commercial display devices. EL devices use thin-film layers of materials coated upon a substrate that emit light when electric current is passed through them. In OLED devices, one or more of those layers includes organic material. Using active-matrix control schemes, a plurality of EL light-emitting devices can be assembled into an EL display. EL subpixels, each including an EL device and a drive circuit, are typically arranged in two-dimensional arrays with a row and a column address for each subpixel, and are driven by a data value associated with each subpixel to emit light at a brightness corresponding to the associated data value. To make a full-color display, one or more subpixels of different colors are grouped together to form a pixel. Thus each pixel on an EL display includes one or more subpixels, e.g. red, green, and blue. The collection of all the subpixels of a particular color is commonly called a "color plane." A monochrome display can be considered to be a special case of a color display having only one color plane.

Typical large-format displays (e.g. having a diagonal of greater than 12 to 20 inches) employ hydrogenated amorphous silicon thin-film transistors (a-Si TFTs) formed on a substrate to drive the subpixels in such large-format displays. Amorphous Si backplanes are inexpensive and easy to manufacture. However, as described in "Threshold Voltage Instability Of Amorphous Silicon Thin-Film Transistors Under Constant Current Stress" by Jahinuzzaman et al. in Applied Physics Letters 87, 023502 (2005), the a-Si TFTs exhibit a metastable shift in threshold voltage ($V_{th}$) when subjected to prolonged gate bias. This shift is not significant in traditional display devices such as LCDs, because the current required to switch the liquid crystals in LCD display is relatively small. However, for LED applications, much larger currents must be switched by the a-Si TFT circuits to drive the EL materials to emit light. Thus, EL displays employing a-Si TFT circuits generally exhibit a significant $V_{th}$ shift as they are used. This $V_{th}$ shift can result in decreased dynamic range and image artifacts. Moreover, the organic materials in OLED and hybrid EL devices also deteriorate in relation to the integrated current density passed through them over time, so that their efficiency drops while their resistance to current, and thus forward voltage, increases. These effects are described in the art as "aging" effects.

These two factors, TFT and EL aging, reduce the lifetime of the display. Different organic materials on a display can age at different rates, causing differential color aging and a display whose white point varies as the display is used. If some EL devices in the display are used more than others, spatially differentiated aging can result, causing portions of the display to be dimmer than other portions when driven with a similar signal. This can result in visible burn-in. For example, this occurs when the screen displays a single graphic element in one location for a long period of time. Such graphic elements can include stripes or rectangles with background information, e.g. news headlines, sports scores, and network logos. Differences in signal format are also problematic. For example, displaying a widescreen (16:9 aspect ratio) image letterboxed on a conventional screen (4:3 aspect ratio) requires the display to matte the image, causing the 16:9 image to appear on a middle horizontal region of the display screen and black (non-illuminated) bars to appear on the respective top and bottom horizontal regions of the 4:3 display screen. This produces sharp transitions between the 16:9 image area and the non-illuminated (matte) areas. These transitions can burn in over time and become visible as horizontal edges. Furthermore, the matte areas are not aged as quickly as the image area in these cases, which can result in the matte areas' being objectionably brighter than the 16:9 image area when a 4:3 (full-screen) image is displayed.

One approach to avoiding the problem of voltage threshold shift in TFT circuits is to employ circuit designs whose performance is relatively constant in the presence of such voltage shifts. For example, U.S. Patent Application Publication No. 2005/0269959 by Uchino et al describes a subpixel circuit having a function of compensating for characteristic variation of an electro-optical element and threshold voltage variation of a transistor. The subpixel circuit includes an electro-optical element, a holding capacitor, and five -channel thin-film transistors. Alternative circuit designs employ current-mirror driving circuits that reduce susceptibility to transistor performance. For example, U.S. Patent Application Publication No. 2005/0180083 by Takahara et al., describes such a circuit. However, such circuits are typically much larger and more complex than the two-transistor, single capacitor (2T1C) circuits otherwise employed, thereby reducing the aperture ratio (AR), the percent of the area on a display available for emitting light. The decrease in AR decreases the display lifetime by increasing the current density through each EL device.

Other methods used with a-Si TFTs rely upon measuring the threshold-voltage shift. For example, U.S. Patent Application Publication No. 2004/0100430A1 by Fruehauf describes an OLED subpixel circuit including a conventional 2T1C subpixel circuit and a third transistor used to carry a current to an off-panel current measurement circuit. As Vth shifts and the OLED ages, the current decreases. This decrease in current is measured and used to adjust the data value used to drive the subpixel. Similarly, U.S. Pat. No. 6,433,488 B1 by Bu describes using a third transistor to measure the current flowing through an OLED device under a test condition and comparing that current to a reference current to adjust the data value. Additionally, Arnold et al., in commonly-assigned U.S. Pat. No. 6,995,519, teach using a third transistor to produce a feedback signal representing the voltage across the OLED, permitting compensation of OLED aging but not Vth shift. However, although these schemes do not require as many transistors as subpixel circuits with internal compensation, they do require additional signal lines on a display backplane to carry the measurements. These additional signal lines reduce aperture ratio and add assembly cost. For example, these schemes can require one additional data line per column. This doubles the number of lines that have to be bonded to driver integrated circuits, increasing the cost of an assembled display, and increasing the probability of bond failure, thus decreasing the yield of good displays from the assembly line. This problem is particularly acute for large-format, high-resolution displays, which can have over two thousand columns. However, it also affects smaller displays, as higher bondout counts can require higher-density connections, which are more expensive to manufacture and have lower yield than lower-density connections.

Alternative schemes for reducing image burn-in have been addressed for televisions using a cathode ray tube display. U.S. Pat. No. 6,359,398, describes methods and apparatus that are provided for equally aging a cathode ray tube (CRT). Under this scheme, when displaying an image of one aspect ratio on a display of a different aspect ratio, the matte areas of the display are driven with an equalization video signal. In this manner, the CRT is uniformly aged. However, the solution proposed requires the use of a blocking structure such as doors or covers that can be manually or automatically provided to shield the matte areas from view when the equalization video signal is applied to the otherwise non-illuminated region of the display. This solution is unlikely to be acceptable to most viewers because of the cost and inconvenience. U.S. Pat. No. 6,359,398 also discloses that matte areas can be illuminated with gray video having luminance intensity matched to an estimate of the average luminous intensity of the program video displayed in the primary region. As indicated therein, however, such estimation is not perfect, resulting in a reduced, but still present, non-uniform aging.

U.S. Pat. No. 6,369,851 describes a method and apparatus for displaying a video signal using an edge modification signal to reduce spatial frequency and minimize edge burn lines, or a border modification signal to increase brightness of image content in a border area of a displayed image, where the border area corresponds to a non-image area when displaying images with a different aspect ratio. However, these solutions can cause objectionable image artifacts, for example reduced sharpness or visibly brighter border areas in displayed images.

The general problem of regional brightness differences due to burn-in of specific areas due to video content has been addressed in the prior art, for example in U.S. Pat. No. 6,856,328. This disclosure teaches that the burn-in of graphic elements as described above can be prevented by detecting those elements in the corners of the image and reducing their intensity to the average display load. This method requires the detection of static areas and cannot prevent color-differentiated burn-in. An alternative technique is described in Japanese Publication No. 2005-037843 A by Igarashi et al. entitled "Camera and Display Control Device". In this disclosure, a digital camera is provided with an organic EL display that is prevented from burning in by employing a DSP in the digital camera. The DSP changes the position of an icon on the organic EL display by changing the position of the icon image data in a memory every time that the camera is turned on. Since the degree to which the display position is changed is approximately one pixel a user cannot recognize the change in the display position. However, this approach requires a prior knowledge and control of the image signal and does not address the problem of format differences.

U.S. Patent Application Publication No. 2005/0204313 A1 by Enoki et al. describes a further method for display screen burn prevention, wherein an image is gradually moved in an oblique direction in a specified display mode. This and similar techniques are generally called "pixel orbiter" techniques. Enoki et al. teach moving the image as long as it displays a still image, or at predetermined intervals. Kota et al., in U.S. Pat. No. 7,038,668, teach displaying the image in a different position for each of a predetermined number of frames. Similarly, commercial plasma television products advertise pixel orbiter operational modes that sequentially shift the image three pixels in four directions according to a user-adjustable timer. However, these techniques cannot employ all pixels of a display, and therefore can create a border effect of pixels that are brighter than those pixels in the image area that are always used to display image data.

Existing methods for mitigating image burn-in on EL displays generally either require additional display circuitry or manipulate the displayed image. Methods requiring additional display circuitry can reduce the lifetime of the display, increase its cost, and reduce manufacturing yield. Methods manipulating the displayed image cannot correct for all burn-in. Accordingly, there is a need for an improved method and apparatus for providing improved display uniformity in electroluminescent flat-panel display devices.

SUMMARY OF THE INVENTION

It is therefore an object of the present invention to compensate for aging and efficiency changes in OLED emitters in the presence of transistor aging.

This object is achieved by a method of compensating for changes in the characteristics of transistors and electroluminescent devices in an electroluminescent display, comprising:

(a) providing an electroluminescent display having a two-dimensional array of subpixels arranged in rows and columns to form a plurality of pixels, with each pixel having at least three subpixels of different colors, with each subpixel in a pixel having an electroluminescent device and a drive transistor, wherein each electroluminescent device is driven by the corresponding drive transistor in response to a drive signal;

(b) providing in each pixel a readout circuit for one of the subpixels of a specific color having a first readout transistor and a second readout transistor connected in series;

(c) using the readout circuit to derive a correction signal for the specific color subpixel based on the characteristics of at least one of the transistors in the specific color subpixel, or the electroluminescent device in the specific color subpixel; and (d) using the correction signal to adjust the drive signals applied to the drive transistor of the specific color subpixel and the drive transistors of subpixels of the specific color in one or more different pixels.

An advantage of this invention is an OLED display that compensates for the aging of the organic materials in the display and for circuitry aging. It is a further advantage of this invention that it uses simple voltage measurement circuitry. It is a further advantage of this invention that by making all measurements of voltage, it is more sensitive to changes than methods that measure current. It is a further advantage of this invention that compensation for changes in driving transistor properties can be performed with compensation for the OLED changes, thus providing a complete compensation solution. It is a further advantage of this invention that both aspects of measurement and compensation (OLED and driving transistor) can be accomplished rapidly. It is a further advantage of this invention that it uses the existing lines out of a display, therefore not requiring additional connections to external circuitry.

DETAILED DESCRIPTION OF THE INVENTION

Figure 1:
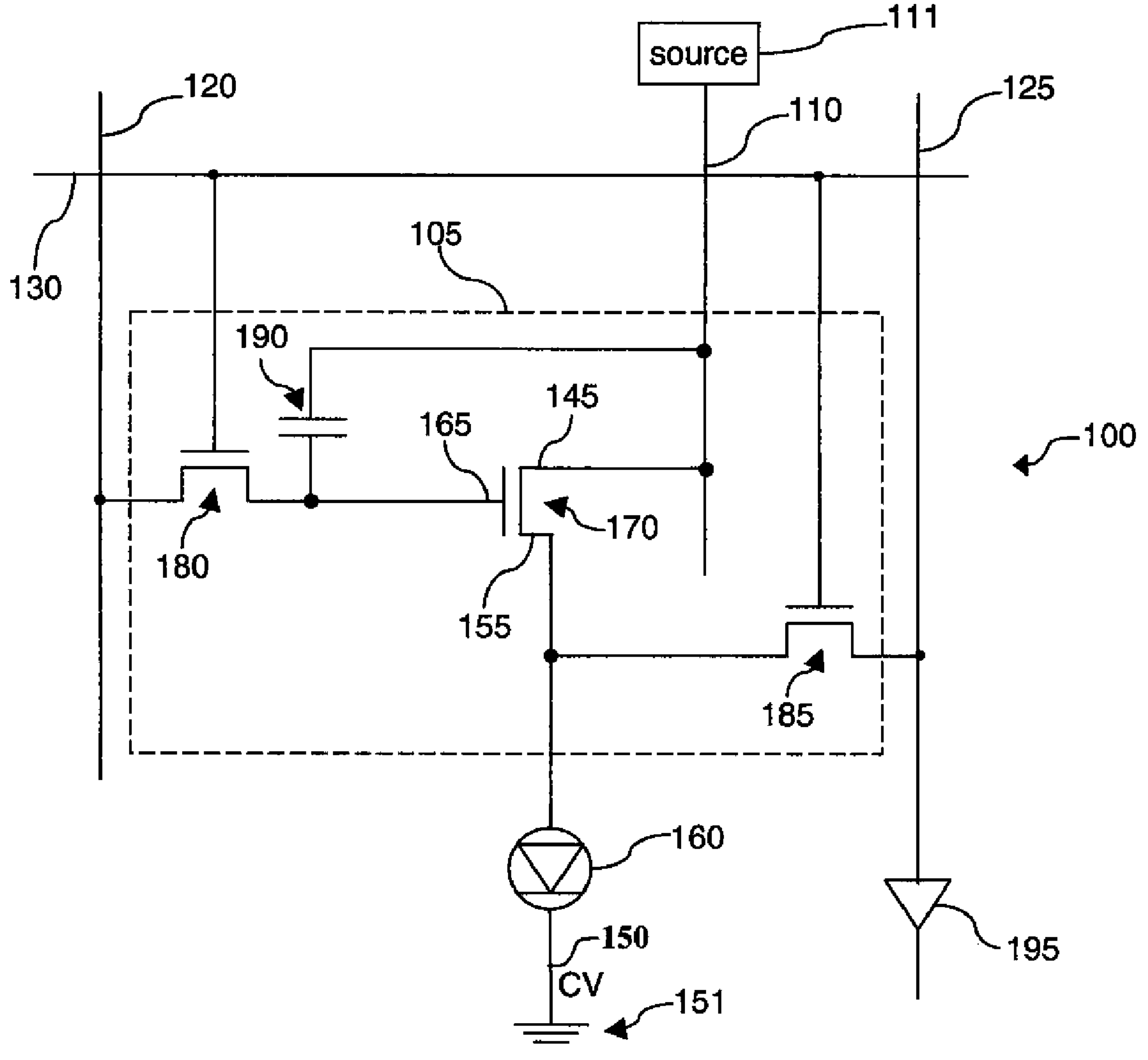
FIG. 1 is a schematic diagram of an electroluminescent subpixel which can be useful in the present invention.

Turning now to FIG. 1, there is shown a schematic diagram of an electroluminescent (EL) subpixel as described by Levey et al. in above-cited commonly assigned U.S. patent application Ser. No. 11/766,823. Such subpixels are well known in the art in active matrix EL displays. One useful example of an EL display is an organic light-emitting diode (OLED) display. EL subpixel 100 includes a light-emitting EL device 160 and a drive circuit 105. EL subpixel 100 is connected to a data line 120, a first power supply line 110 driven by a first voltage source 111, a select line 130, and a second power supply line 150 driven by a second voltage source 151. By connected, it is meant that the elements are directly connected or connected via another component e.g. a switch, a diode, another transistor, etc. Drive circuit 105 includes a drive transistor 170, a switch transistor 180, and a capacitor 190. Drive transistor 170 can be an amorphous-silicon (a-Si) transistor. It has first electrode 145, a second electrode 155, and a gate electrode 165. First electrode 145 of drive transistor 170 is connected to first power supply line 110, while second electrode 155 is connected to EL device 160. In this embodiment of drive circuit 105, first electrode 145 of drive transistor 170 is a drain electrode and second electrode 155 is a source electrode, and drive transistor 170 is an n-channel device. In this embodiment EL device 160 is a non-inverted EL device that is connected to drive transistor 170 and to second voltage source 151 via second power supply line 150. In this embodiment, the second voltage source 151 is ground. Those skilled in the art will recognize that other embodiments can use other sources as the second voltage source. A switch transistor 180 has a gate electrode connected to select line 130, as well as source and drain electrodes, one of which is connected to a gate electrode 165 of drive transistor 170, and the other of which is connected to data line 120.

EL device 160 is powered by flow of current between first power supply line 110 and second power supply line 150. In this embodiment, the first voltage source 111 has a positive potential relative to the second voltage source 151, to cause current to flow through drive transistor 170 and EL device 160, so that EL device 160 produces light. The magnitude of the current—and therefore the intensity of the emitted light—is controlled by drive transistor 170, and more specifically by the magnitude of the signal voltage on gate electrode 165 of drive transistor 170. During a write cycle, select line 130 activates switch transistor 180 for writing, and the signal voltage data on data line 120 is written to drive transistor 170 and stored on a capacitor 190 that is connected between gate electrode 165 and first power supply line 110.

As discussed above, a-Si transistors such as drive transistor 170, and EL devices such as 160, have aging effects. It is desirable to compensate for such aging effects to maintain consistent brightness and color balance of the display, and to prevent image burn-in. For readout of values useful for such compensation, drive circuit 105 further includes a readout transistor 185, connected to the second electrode 155 of the drive transistor 170 and to readout line 125. The gate electrode of the readout transistor 185 can be connected to the select line 130, or in general to some other readout-selection line. The readout transistor 185, when active, electrically connects second electrode 155 to readout line 125 that carries a signal off the display to electronics 195. Electronics 195 can include, for example, a gain buffer and an AID converter to read the voltage at electrode 155.

Figure 2:
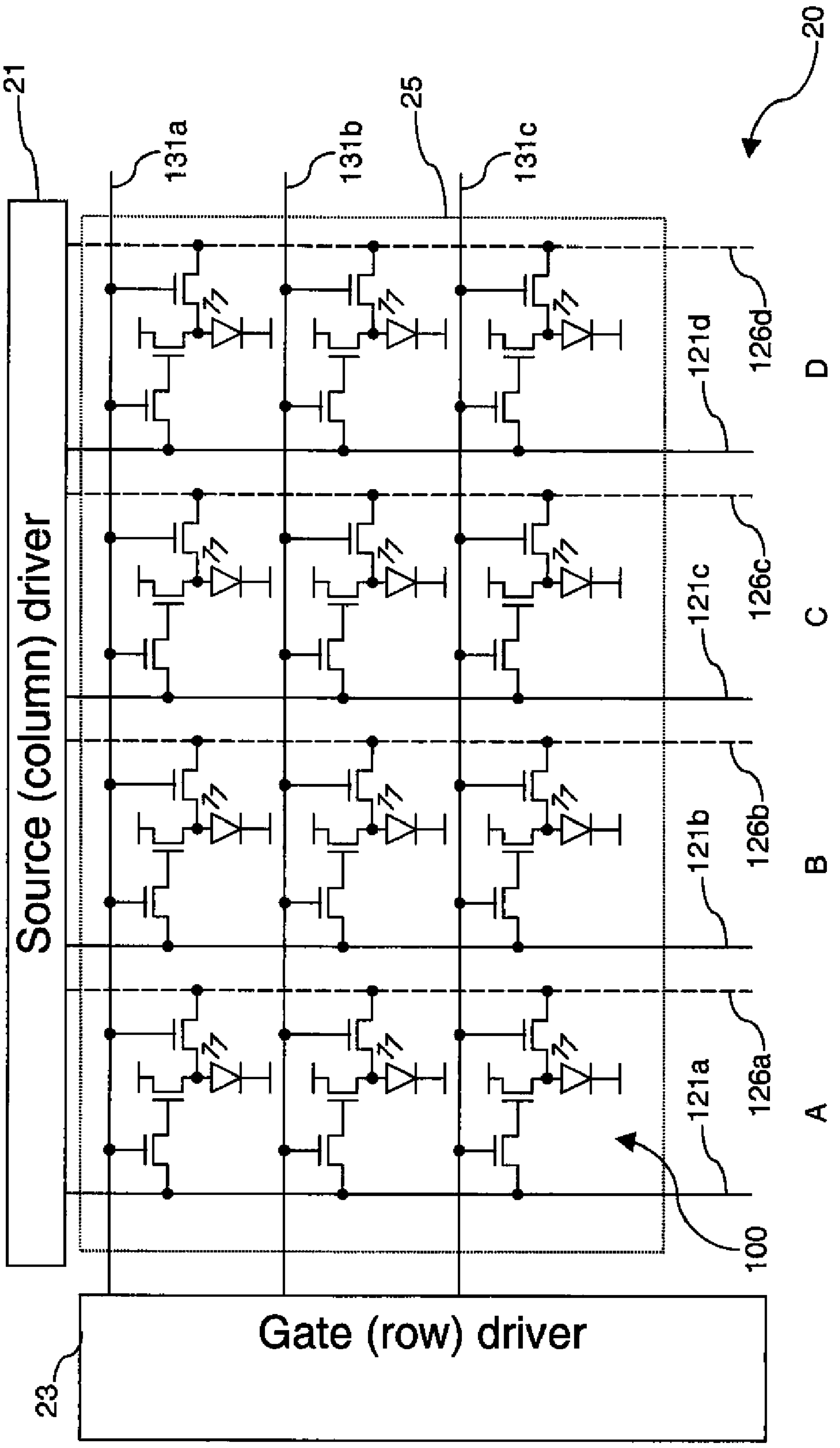
FIG. 2 is a schematic diagram of an EL display which can be useful in the present invention.

Turning now to FIG. 2, there is shown an EL display 20 as described by White et al. in above cited commonly assigned U.S. patent application Ser. No. 11/946,392. A display 20 includes a source driver 21, a gate driver 23, and a display matrix 25. The display matrix 25 has a plurality of EL subpixels 100 arranged in rows and columns. Each row has a select line (**131*a*, 131*b*, 131*c*). Each column has a data line (121*a*, 121*b*, 121*c*, 121*d*) and areadout line (126*a*, 126*b*, 126*c*, 126*d*). Each subpixel includes a drive circuit and an EL device, as shown in FIG. 1. Current is driven through each EL device by a drive transistor in its corresponding drive circuit in response to a drive signal carried on its column's data line and applied to the gate electrode of the drive transistor. As EL devices are generally current-driven, driving current through an EL device with a drive circuit is conventionally referred to as driving the EL device. The column of subpixel circuits connected to data line 121 a will hereinafter be referred to as "column A," and likewise for columns B, C, and D, as indicated on the figure. The readout lines 126*a* to 126*d* are shown dashed on FIG. 2 for clarity only; they are electrically continuous along the whole column. The data lines 121*a* to 121*d* and the readout lines 126*a* to 126*d* are all connected to source driver 21**, doubling the bond count required for external connection when compared to a simple two-transistor, one-capacitor (2T1C) design. The readout lines can also be connected to a readout circuit not included in the source driver. The terms "row" and "column" do not imply any particular orientation of the EL display. Rows and columns can be interchanged without loss of generality. The readout lines can be oriented in other configurations than parallel to the column lines.

Figure 3:
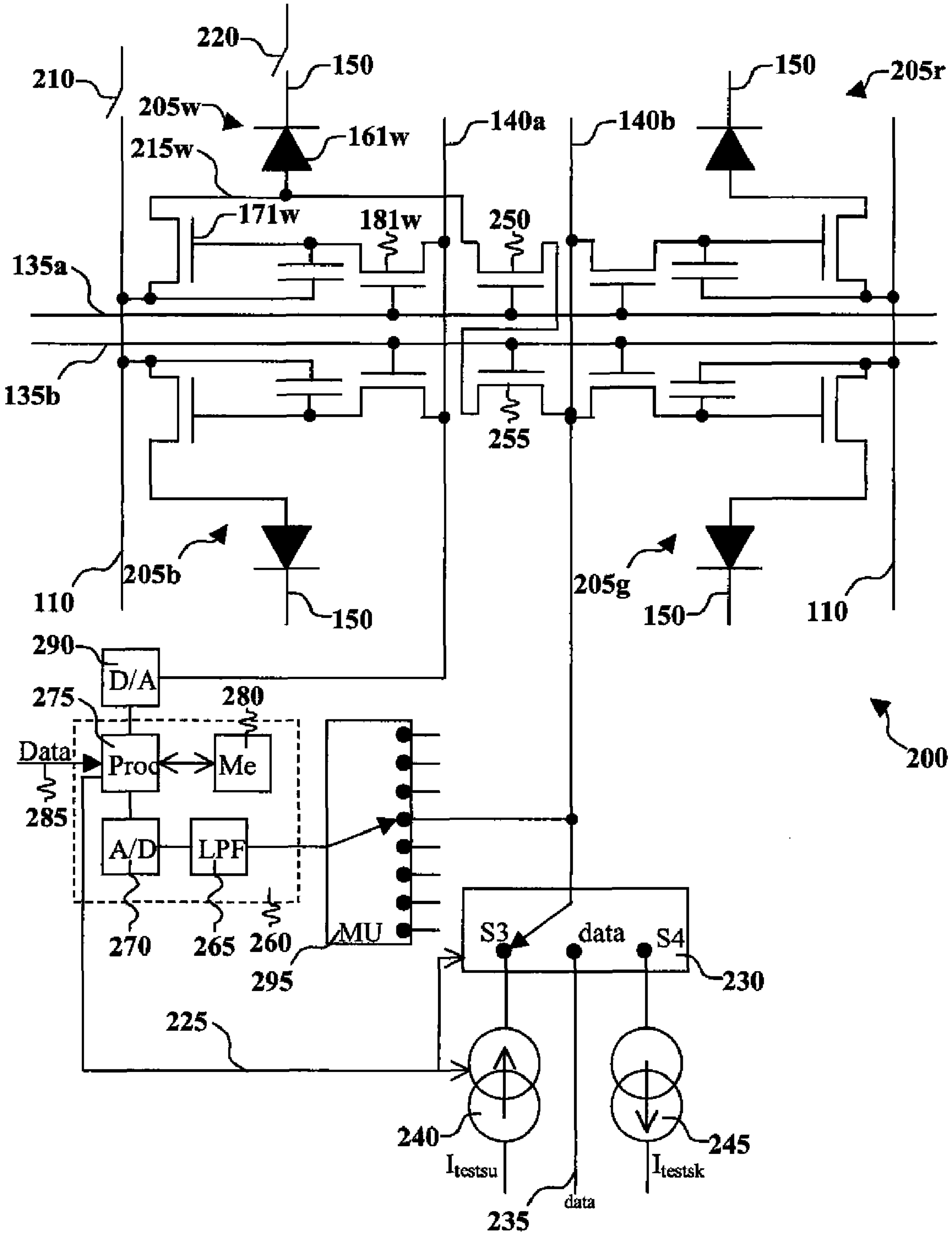
FIG. 3 is a schematic diagram of one embodiment of a pixel drive circuit for an electroluminescent pixel that can be used in the practice of this invention.

Turning now to FIG. 3, there is shown a schematic diagram of one embodiment of a pixel drive circuit for an electroluminescent pixel that can be used in the practice of this invention. Electroluminescent pixel 200 is part of an electroluminescent (EL) display that has a two-dimensional array of subpixels, e.g. subpixels **205*w*, 205*b*, 205*r*, and 205*g*, arranged in rows and columns to form a plurality of pixels. Each pixel has at least three subpixels of different colors. The at least tree subpixels are desirably arranged in at least two rows as shown here. This embodiment uses a quad pixel pattern, but other pixel patterns known in the art, such as horizontal or vertical stripe, can be used with the present invention. In the embodiment shown in FIG. 3, pixel 200 includes four subpixels of different colors: white subpixel 205*w*, red subpixel 205*r*, blue subpixel 205*b*, and green subpixel 205*g*. Each subpixel has an electroluminescent device that is electrically connected to a corresponding drive transistor at an intermediate node. The electroluminescent device is driven by the corresponding drive transistor in response to a drive signal, which is conveyed to the drive transistor from a data line by a corresponding switch transistor. For example, subpixel 205$w$ includes EL device 161$w$, intermediate node 215$w$, drive transistor 171$w$, and switch transistor 181$w$, and is connected to first data line 140$a$. The data lines provide drive signals to the drive transistors to cause the corresponding EL devices to emit colored light. The colored light can be any color, including white. The colored light can be provided directly by the EL devices, e.g. by providing different emitters for different colored subpixels, or by providing broad-band-emitting, e.g. white, EL devices with color filters as known in the art. The other subpixels have corresponding structures, which are correspondingly numbered. The display further includes first power supply lines 110, which are connected to a common first voltage source as described above, and second power supply lines 150, which are connected to a common second voltage source as described above. The display further includes data lines (e.g. first and second data lines 140$a$ and 140$b$) and select lines (e.g. 135$a$ and 135$b$) for providing drive signals to the subpixels as well-known in the art. Each row of subpixels is provided with a corresponding select line, e.g. select line 135$a$ for the row of subpixels 205$w$ and 205$r$. Each column of subpixels is provided with a corresponding data line, e.g. first data line 140$a$ for subpixels 205$w$ and 205$b$, and second data line 140$b$ for subpixels 205$r$ and 205$g$, for providing drive signals to the drive transistor. However, one of the subpixels in each pixel (e.g. subpixel 205$w$ in pixel 200) has first data line 140$a$ for providing the drive signals to first transistor 171$w$, and has second data line 140**$b$ for receiving readout signals under conditions that will be described herein. This subpixel will be referred to as the subpixel of the specific color in each pixel.

The display also includes a first switch 210 and a second switch 220 connected to first power supply line 110 and second power supply line 150, respectively. First switch 210 and second switch 220 are desirably located off-panel, and though not shown for the sake of clarity, the switches are connected to all respective power supply lines on the display. At least one first switch 210 and second switch 220 are provided for the OLED display. Additional first and second switches can be provided if the OLED display has multiple powered subgroupings of pixels. First switch 210 selectively connects a first voltage source, via first power supply line 110, to a first electrode of each drive transistor, e.g. white subpixel drive transistor 171$w$. Second switch 220 selectively connects a second voltage source, via second power supply line 150, to each EL device, e.g. EL device 161$w$. The display also includes a switch block 230 that selectively connects second data line 140$b$ to a data line 235, a current source 240 (selectively via third switch S3), or a current sink 245 (selectively via fourth switch S4). In normal display mode, first and second switches 110 and 120 are closed, while other switches (described below) are open; that is, switch block 230 is set to data line 235, and second data line 140$b$ therefore functions as a normal data line to provide drive signals to the drive transistors, e.g. of subpixels 205$r$ and 205$g$, to cause the subpixels to emit colored light. In normal display mode, first data line 140$a$ provides drive signals to another column of subpixels, e.g. subpixels 205$w$ and 205$b$. While the third and fourth switches can be individual entities, they are never closed simultaneously in this method, and thus switch block 230 provides a convenient embodiment of the two switches. Switch block 230, current source 240, and current sink 245 can be located on or off the OLED display substrate.

Each pixel includes a readout circuit for one of the subpixels of a specific color. The readout circuit can be activated in readout mode and will provide at least one readout signal, which will be described further below. The readout circuit includes a first readout transistor 250 and a second readout transistor 255 connected in series, and first readout transistor 250 is connected in this pixel to intermediate node 215$w$ of white subpixel 205$w$. The gate electrode of first readout transistor 250 is connected to first select line 135$a$, while the gate of second readout transistor 255 is connected to second select line 135$b$. Thus, two select lines must be activated simultaneously to activate the readout circuit. As will be described below, other pixels will have different color subpixels connected to the readout circuit. Thus, for the entire display, the number of subpixels of each color that are connected to a readout circuit will be substantially the same. Switch block 230 is used in conjunction with readout transistors 250 and 255. The third switch S3 permits current source 240 to be selectively connected via second data line 140$b$ to subpixel 205$w$ to permit a predetermined constant current to flow into subpixel 205$w$. The fourth switch S4 permits current sink 245 to be selectively connected via second data line 140$b$ to subpixel 205$w$ to permit a predetermined constant current to flow from subpixel 205$w$ when a predetermined data value is applied to data line 140$a$.

A voltage measurement circuit 260, is further provided and connected to second data line 140$b$. Voltage measurement circuit 260 measures voltages to derive a correction signal to adjust the drive signals applied to the drive transistors. Voltage measurement circuit 260 includes at least analog-to-digital converter 270 for converting voltage measurements into digital signals, and a processor 275. The signal from analog-to-digital converter 270 is sent to processor 275. Voltage measurement circuit 260 can also include a memory 280 for storing voltage measurements, and a low-pass filter 265 if necessary. Other embodiments of voltage measurement circuits will be clear to those skilled in the art. Voltage measurement circuit 260 can be connected through a multiplexer 295 to a plurality of second data lines 140$b$ and readout transistors 250 and 255 for sequentially reading out the voltages from a predetermined number of subpixels. Processor 275 can also be connected to first data line 140$a$ by way of a digital-to-analog converter 290. Thus, processor 275 can also serve as a test voltage source for applying a predetermined test potential to first data line 140$a$ during the measurement process to be described herein. Processor 275 can also accept display data via data input 285 and provide compensation for changes as will be described herein, thus providing compensated data to first data line 140$a$ during the display process.

Instead of a voltage measurement circuit, one can use a compensation circuit such as a comparator to compare the voltage on second data line 140$b$ to a known reference. This can provide a lower-cost apparatus than embodiments that include a voltage measurement circuit.

A controller can also be provided for driving the specific color subpixel to provide readout signals. The controller can be processor 275. The controller can open and close any of the first through fourth switches, can set current sink 245 to draw a predetermined test current, and can set current source 240 to drive a predetermined test current. This is shown schematically by control bus 225. For clarity of illustration, control bus 225 is only shown to switch block 230 and current source 240, but it will be understood that control bus 225 permits the controller to set any switch, current sink, current source, data lines, select lines, or multiplexer, as required.

In normal operation, the display operates as an active-matrix display as well-known in the art. Data is placed upon data lines (e.g. 140$a$, 140$b$) and a select line (e.g. 135$a$) is activated to place that data onto the gate electrodes of the corresponding drive transistors to drive the corresponding EL devices at the desired level. A single select line is activated at a time. In this mode, subpixel 205$w$ is connected to first data line 140$a$, but not to second data line 140$b$.

Each pixel 200 of the display has another mode, which will herein be called readout mode. In readout mode, two adjacent select lines are activated simultaneously, e.g. first and second select lines 135$a$ and 135$b$, thereby activating the readout circuit by activating first and second readout transistors 250 and 255, and connecting subpixel 205$w$ to second data line 140$b$. Thus, in readout mode, specific color subpixel 205$w$ has two data lines: a first data line 140$a$, which provides drive signals to drive transistor 171$w$ as usual, and a second data line 140$b$, which will receive readout signals from subpixel 205$w$ and apply them to voltage measurement circuit 260 or to the compensation circuit if used instead.

Figure 4:
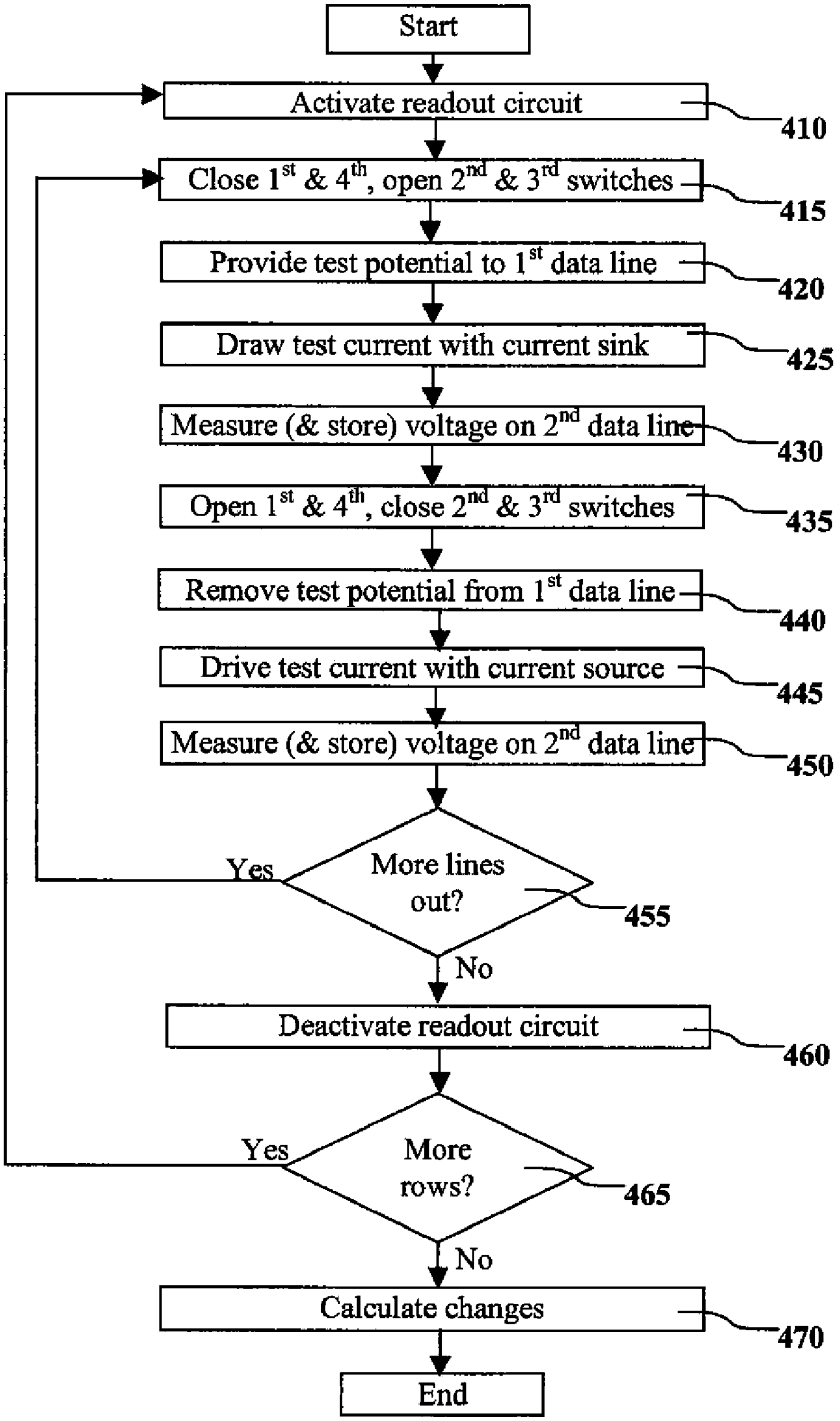
FIG. 4 is a block diagram showing one embodiment of the method of this invention.

Turning now to FIG. 4, and referring also to FIG. 3, there is shown a block diagram of one embodiment of the method of compensating for changes in the characteristics of transistors and EL devices in an EL display, as embodied in the present invention. The method separately tests the drive transistor and the EL device of the specific color subpixel in each pixel. The readout circuit is activated, that is both readout transistors 250 and 255 are activated by simultaneously activating select lines 135$a$ and 135$b$ (Step 410). First switch 210 is closed and second switch 220 is opened. The fourth switch is closed and the third switch is opened, that is, switch block 230 is switched to S4 (Step 415). A predetermined test potential ($V_{data}$) is provided to first data line 140$a$ and thus to drive transistor 171$w$ by the test voltage source, e.g. processor 275 (Step 420). Current sink 245 is set to draw a predetermined test current (Step 425). A current thus flows from first power supply line 110 through drive transistor 171$w$ and second data line 140$b$ to current sink 245. The value of current ($I_{testsk}$) through current sink 245 is selected to be less than the resulting current through drive transistor 171$w$ due to the application of $V_{data}$; a typical value will be in the range of 1 to 5 microamps and will be constant for all measurements during the lifetime of the pixel. $V_{data}$ therefore must be sufficient to provide a current through drive-transistor 171$w$ greater than that at current sink 245 even after aging expected during the lifetime of the display. Thus, the limiting value of current through drive transistor 171$w$ will be controlled entirely by current sink 245. The value of $V_{data}$ can be selected based upon known or determined current-voltage and aging characteristics of drive transistor 171$w$. More than one measurement value can be used in this process, e.g. one can choose to do the measurement at 1, 2, and 3 microamps using a value of $V_{data}$ that is sufficient to remain constant for the largest current during the lifetime of the OLED drive circuit. Voltage measurement circuit 260 is used to test drive transistor 171$w$ by measuring the voltage on second data line 140$b$, which is the voltage at the second electrode of readout transistor 255, providing a first readout signal $V_1$ that is representative of characteristics, including the threshold voltage $V_{th}$, of drive transistor 171$w$ (Step 430).

First switch 210 is then opened and second switch 220 is closed. The fourth switch is opened and the third switch is closed, that is, switch block 230 is switched to S3 (Step 435). The predetermined test potential is removed from first data line 140$a$ (Step 440). It is not necessary to activate the readout circuit, which remains active from the measurement of $V_1$. However, other variations of the method are possible wherein it is necessary to deactivate and then reactivate the readout circuit between these measurements. Current source 240 is set to drive a predetermined test current (Step 445). A current, $I_{testu}$, thus flows from current source 240 through second data line 140$b$ and EL device 161$w$ to second power supply line 150. The value of current through current source 240 is selected to be less than the maximum current possible through EL device 161$w$; a typical value will be in the range of 1 to 5 microamps and will be constant for all measurements during the lifetime of the OLED drive circuit. More than one measurement value can be used in this process, e.g. one can choose to do the measurement at 1, 2, and 3 microamps. Voltage measurement circuit 260 is used to test the EL device by measuring the voltage on second data line 140$b$, which is the voltage at the second electrode of readout transistor 255, providing a second readout signal $V_2$ that is representative of characteristics, including the resistance, of EL device 161$w$ (Step 450). If there are additional pixels in the row to be measured (Step 455), multiplexer 295 connected to a plurality of second data lines 140$b$ can be used to permit voltage measurement circuit 260 to sequentially read out the first and second readout signals $V_1$ and $V_2$ for a predetermined number of pixels, e.g. every pixel in the row, and steps 415 to 450 are repeated as necessary. If the display is sufficiently large, it can require a plurality of multiplexers wherein the signals can be provided in a parallel/sequential process. If there are no more pixels to be read in the row, the readout circuit is deactivated, meaning that select lines 135$a$ and 135$b$ are deselected (Step 460). If there are additional rows of circuits to be measured in the display (Step 465), Steps 415 to 460 are repeated for each row. At the end of the process, necessary changes for each pixel can be calculated (Step 470), which will now be described.

Transistors such as drive transistor 171$w$ have a characteristic threshold voltage ($V_{th}$). The voltage on the gate electrode of drive transistor 171$w$ must be greater than the threshold voltage to enable current flow between the first and second electrodes. When drive transistor 171$w$ is an amorphous silicon transistor, the threshold voltage is known to change under aging conditions. Such conditions include placing drive transistor 171$w$ under actual usage conditions, thereby leading to an increase in the threshold voltage. Therefore, a constant signal on the gate electrode can cause a gradually decreasing light intensity emitted by EL device 161$w$. The amount of such decrease will depend upon the use of drive transistor 171$w$; thus, the decrease can be different for different drive transistors in a display, herein termed 'spatial variations in characteristics of pixel 200. Such spatial variations can include differences in brightness and color balance in different parts of the display, and image "burn-in" wherein an often-displayed image (e.g. a network logo) can cause a ghost of itself to always show on the active display. It is desirable to compensate for such changes in the threshold voltage to prevent such problems. Also, there can be age-related changes to EL device 16 1$w$, e.g. luminance efficiency loss and an increase in resistance across EL device 161$w$.

For the first readout signal, the voltages of the components in the circuit can be related by:

$$V_1 = V_{data} - V_{gs(Itestsk)} - V_{read} \quad \text{(Eq. 1)}$$

where $V_{gs(Itestsk)}$ is the gate-to-source voltage that must be applied to drive transistor 171$w$ such that its drain-to-source current, $I_{ds}$, is equal to $I_{tetsk}$. The values of these voltages will cause the voltage at the second electrode of readout transistor 255, that is, the electrode connected to data line 140$b$, to adjust to fulfill Eq. 1. Under the conditions described above, $V_{data}$ is a set value and $V_{read}$ (the voltage change across readout transistors 250 and 255) can be assumed to be constant. $V_{gs}$ will be controlled by the value of the current set by current sink 245 and the current-voltage characteristics of drive transistor 171$w$, and will change with age-related changes in the threshold voltage of the drive transistor. To determine the change in the threshold voltage of drive transistor 171$w$, two separate test measurements are performed. The first measurement is performed when drive transistor 171$w$ is not degraded by aging, e.g. before pixel 200 is used for display purposes, to cause the voltage $V_1$ to be at a first level, which is measured and stored. Since this is with zero aging, it can be the ideal first signal value, and will be termed the first target signal. After drive transistor 171$w$ has aged, e.g. by displaying images for a predetermined time, the measurement is repeated and stored. The stored results can be compared. Changes to the threshold voltage of drive transistor 171$w$ will cause a change to $V_{gs}$ to maintain the current. These changes will be reflected in changes to $V_1$ in Eq. 1, so as to produce voltage $V_1$ at a second level, which can be measured and stored. Changes in the corresponding stored signals can be compared to calculate a change in the readout voltage $V_1$, which is related to the changes in drive transistor 171$w$ as follows:

$$\Delta V_1 = -\Delta V_{gs} = -\Delta V_{th} \quad \text{(Eq. 2)}$$

Thus, a value of $-\Delta V_1$ can be derived for a correction signal for white subpixel 205$w$ based on the characteristics of drive transistor 171$w$ of that subpixel.

For the second readout signal, the voltages of the components in the circuit can be related by:

$$V_2 = CV + V_{EL} + V_{read} \quad \text{(Eq. 3)}$$

where $V_{EL}$ is the potential loss across EL device 161$w$. The values of these voltages will cause the voltage at the second electrode of readout transistor 255 to adjust to fulfill Eq. 3. Under the conditions described above, CV is a set value (the voltage of second power supply line 150) and $V_{read}$ can be assumed to be constant. $V_{EL}$ will be controlled by the value of current set by current source 240 and the current-voltage characteristics of EL device 161$w$. $V_{EL}$ can change with age-related changes in EL device 161$w$. To determine the change in $V_{EL}$, two separate test measurements are performed. The first measurement is performed when EL device 161$w$ is not degraded by aging, e.g. before pixel 200 is used for display purposes, to cause the voltage $V_2$ to be at a first level, which is measured and stored. Since this is with zero aging, it can be the ideal second signal value, and will be termed the second target signal. After EL device 161$w$ has aged, e.g. by displaying images for a predetermined time, the measurement is repeated and stored. The stored results can be compared. Changes in EL device 161$w$ can cause changes to $V_{EL}$ to maintain the current. These changes will be reflected in changes to $V_2$ in Eq. 3, so as to produce voltage $V_2$ at a second level, which can be measured and stored. Changes in the corresponding stored signals can be compared to calculate a change in the readout voltage, which is related to the changes in EL device 161$w$ as follows:

$$\Delta V_2 = \Delta V_{EL} \quad \text{(Eq. 4)}$$

Thus, a value of $\Delta V_2$ can be derived for a correction signal for white subpixel 205$w$ based on the resistance characteristic of EL device 161$w$ of that subpixel.

The changes in the first and second signals can then be used to compensate for changes in characteristics of subpixel 205$w$ (Step 470). For compensating for the change in current, it is necessary to make a correction for $\Delta V_{th}$ (related to $\Delta V_1$) and $\Delta V_{EL}$ (related to $\Delta V_2$). However, a third factor also affects the luminance of the EL device and changes with age or use: the efficiency of the EL device decreases, which decreases the light emitted at a given current, as described by Levey et al. in above cited commonly assigned U.S. patent application Ser. No. 11/766,823 the disclosure of which is incorporated herein by reference. In addition to the relations above, Levey et al. described a relationship between the decrease in luminance efficiency of an EL device and $\Delta V_{EL}$, that is, where the EL luminance for a given current is a function of the change in $V_{EL}$:

$$\frac{L_{EL}}{I_{EL}} = f(\Delta V_{EL}) \quad \text{(Eq. 5)}$$

By measuring the luminance decrease and its relationship to $\Delta V_{EL}$ with a given current, a change in corrected signal necessary to cause the EL device 161$w$ to output a nominal luminance can be determined. This measurement can be done on a model system and thereafter stored in a lookup table or used as an algorithm.

To compensate for the above changes in characteristics of transistors and EL devices of subpixel 205$w$, one can use the changes in the first and second signals in an equation of the form:

$$\Delta V_{data} = f_1(\Delta V_1) + f_2(\Delta V_2) + f_3(\Delta V_2) \quad \text{(Eq. 6)}$$

where $\Delta V_{data}$ is a correction signal used to adjust the drive signal applied to the gate electrode of drive transistor of the specific color subpixel (e.g. drive transistor 171$w$) so as to maintain the desired luminance, $f_1(\Delta V_1)$ is a correction signal for the change in threshold voltage of drive transistor 171$w$, $f_2(\Delta V_2)$ is a correction signal for the change in resistance of EL device 161$w$, and $f_3(\Delta V_2)$ is a correction signal for the change in efficiency of EL device 161$w$. For example, the EL display can include a compensation controller which can include a lookup table or algorithm to compute an offset voltage for each measured EL device. The correction signal is computed to provide corrections for changes in current due to changes in the threshold voltage of drive transistor 171$w$ and aging of EL device 161$w$, as well as providing a current increase to compensate for efficiency loss due to aging of EL device 161$w$, thus providing a complete compensation solution for the measured subpixel. These changes can be applied by the compensation controller to correct the light output to the nominal luminance value desired. By controlling the drive signal applied to the EL device, an EL device with a constant luminance output and increased lifetime at a given luminance is achieved. Because this method provides a correction for each measured EL device in a display, it will compensate for spatial variations in the characteristics of a plurality of EL circuits.

This method can also correct for variations in the characteristics of a plurality of EL circuits on a panel before aging. This can be useful, for example, in panels using low-temperature polysilicon (LTPS) transistors, which can have non-uniform threshold voltage and mobility across a panel. At any time, for example when a panel is manufactured, this method can be employed to measure values for $V_1$ of each subpixel of a specific color (e.g. 205$w$) on the display, as described above. Then, a first target signal can be selected or calculated from the $V_1$ measurements. For example, the maximum measured $V_1$ or the average of all $V_1$ values can be selected as the first target signal. This first target signal can then be used as the first level of voltage $V_1$ in Eq. 2, and the actual measured $V_1$ for each subpixel can be used as the second level of voltage $V_1$. This permits compensation for variations in the characteristics of drive transistors e.g. 171$w$ before aging. Likewise, $V_2$ can be measured for each EL device e.g. 161$w$ and compensation applied using a selected, maximum or average $V_2$ as the second target signal, and thus first level of voltage $V_2$ in Eq. 3, and each individual $V_3$ measurement as the second level of voltage $V_2$. In cases where mobility varies across a panel, $V_1$ can be measured at two different values of $I_{testsk}$. This provides two points which can be used to determine both the offset (due to $V_{th}$) and the slope (due to mobility) of the transfer curve of drive transistor 171w.

Figure 5:
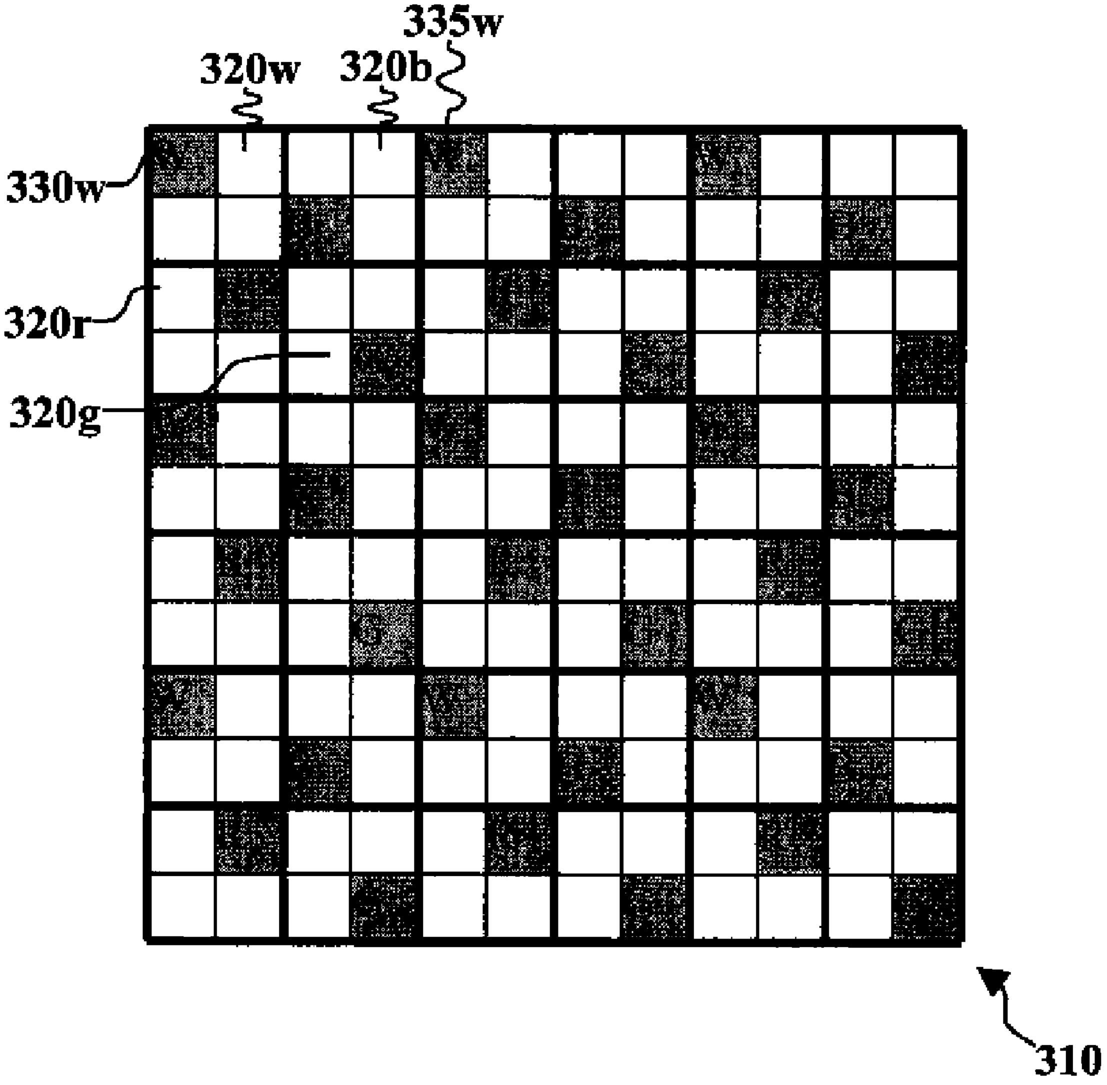
FIG. 5 is a plan view of one embodiment of an EL display that can be used in the practice of the present invention.

Turning now to FIG. 5, there is shown a plan view of one embodiment of an EL display that can be used in the practice of the present invention. An EL display 310 includes a two-dimensional array of subpixels arranged in rows and columns to form a plurality of pixels. Pixels are indicated by the heavier lines. Four subpixels, indicated by lighter lines, form each subpixel. For example, pixel 320w includes four subpixels as shown in FIG. 3. Each subpixel in a pixel has a drive transistor and an EL device. Each EL device is driven by the corresponding drive transistor in response to a drive signal, as described above, to provide an image on EL display 310. In pixel 320w, white subpixel 330w is connected to the readout circuit as shown in FIG. 3. In other pixels, a different subpixel can be connected to the readout circuit. In pixel 320r, the red subpixel is connected to the readout circuit; in pixel 320b, the blue subpixel is connected to the readout circuit; and in pixel 320g, the green subpixel is connected to the readout circuit. Thus, each color subpixel is connected to the readout circuit in one-fourth of the pixels of the display. The data line used as the readout line is changed as necessary. Thus, referring also to FIG. 3, data line 140a is the first data line and data line 140b is the second data line. For a pixel in which subpixel 205r is to be read, e.g. pixel 320r, data line 140b must be the first data line, to provide a drive signal to drive transistor 171r, and data line 140a will therefore be the second data line for receiving readout signals. Thus, each data line, e.g. 140a and 140b, can be either the first or second data line, depending upon the pixel, and will require a switch block 230. Additional connections to multiplexer 295 can handle the necessary changes.

To correct for aging, a correction signal can be derived based on the characteristics of at least one of the transistors in a first drive circuit, or the EL device, or both, as described above. However, a correction signal for only one subpixel out of four in this embodiment is determined this way. This correction signal can be used to correct for burn-in by adjusting the drive signals applied to the first subpixel and one or more adjacent second subpixels. Because different colored subpixels can be utilized differently and thus have different aging characteristics, it is desirable that the adjustment be performed on adjacent subpixels in the same color plane. Thus, "adjacent" for a color display means "adjacent, discounting intervening columns or rows of different colors" according to common practice in the color image processing art. For example, the correction signal from subpixel 330w can be used to adjust the drive signals applied to white subpixels of one or more adjacent pixels, e.g. of pixels 320b and 320r. Alternatively, the correction signals from subpixels 330w and 335w can be averaged to correct the white subpixel of pixel 320b. Other methods for applying signals from subpixels to adjacent or neighboring subpixels will be obvious to those skilled in the art. This permits compensating for changes in the characteristics of transistors and EL devices. Thus, the correction signal derived to adjust the drive signals applied to the drive transistor of a specific color subpixel can also be applied to the drive transistors of subpixels of the specific color in one or more different pixels.

Some images create burn-in patterns with sharp edges when displayed for long periods of time. For example, letterboxing, as described above, creates two sharp horizontal edges between the 16:9 image area and the matte areas. As a result, it is desirable for the correction signals to have a sharp transition at these boundaries to provide an appropriate compensation. It can therefore be advantageous to apply edge detection algorithms as known in the art to the correction signals of a plurality of the subpixels of one or more color planes of the display to determine the location of these sharp transition boundaries for subpixels for which the compensation is not measured but inferred from neighboring subpixels. These algorithms can be employed to determine the presence of sharp transitions. A sharp transition of the correction signals is a significant difference in values of the correction signals between adjacent subpixels or subpixels within a defined distance of each other. A significant change can be a difference between correction signal values of at least 20%, or a difference of at least 20% of the average of a group of neighboring values. Sharp transitions can follow lines, e.g. along horizontal, vertical or diagonal dimensions. In such a linear sharp transition, any subpixel will have a significant difference in correction signal value compared to an adjacent subpixel on the opposite side of the sharp transition. For example, a sharp transition between two adjacent columns is characterized by a significant difference between each subpixel in one column and an adjacent subpixel of the same color plane in the same row.

The location of a sharp transition can be determined using correction signals from neighboring subpixels in the same color plane or subpixels in a different color plane having a correlated signal. If such a transition is found to occur, for any given second subpixel, correction signals from first subpixels on the same side of the transition as the second subpixel can be given higher weight than correction signals from first subpixels on the opposite side of the transition as the second subpixel. This can improve image quality in displays with sharp-edged burn-in patterns with no extra hardware cost. Specifically, this method can be applied by locating one or more sharp transitions in the correction signals over the two-dimensional EL subpixel array using edge-detection algorithms as known in the art; and, for each sharp transition, using the correction signal for a first subpixel to adjust the drive signals applied to the first subpixel and one or more adjacent second subpixels on the same side of the sharp transition. It can be desirable to combine this analysis of burn-in edges, represented by sharp transitions in the correction signals, with an analysis of image content to determine how to apply correction signals to second subpixels, as described by White et al., in above cited commonly assigned U.S. patent application Ser. No. 11/946,392 the disclosure of which is incorporated herein by reference.

This method for compensating for changes in an EL display can be combined with changing the location of the image over time. For example, in the EL display shown in FIG. 5, the image can initially be positioned so that it originates at pixel 320w, that is, so that its upper-left corner is at subpixel 330w. After some time has passed, the image can be moved one pixel to the right so that it originates at pixel 320b. Specifically, the image will be displayed originating at pixel 320w for some time, then there will be a final frame at that position, and the next frame will show the image originating at pixel 320b. Viewers generally cannot see such movement in between frames unless the movement amount is very large. After the image has been moved, at a later time, the image can be moved back to originate at pixel 320w. In this way, pixels 320w and 320b will be driven with the same average data over time, and so will age approximately the same. Additionally, this movement will average the drive of pixels, e.g. 320w and 320b, and so forth across the panel and down all rows. This makes averaging and other combinations of compensation signals even more effective.

In order to improve the accuracy of averaging, therefore, the movement of the image can be confined to the space covered by an averaging operation. For example, the originating location of the image in FIG. 5 can be moved from pixel 320*w*, to pixel 320*b*, to pixel 320*g*, to pixel 320*r*, and back to pixel 320*w*. Additionally, various movement patterns have been taught, for example in U.S. Patent Application Publication No. 2005/0204313 A1. The present invention does not require any particular pattern.

As discussed above, the prior art teaches various methods for determining when to change the location of the image. However, in an EL display, repositioning can be visible while a still image is shown due to the fast subpixel response time of an EL display compared to e.g. an LCD display. Further, changes at predetermined intervals can become visible over time as the human eye is optimized to detect regularity in anything it sees. Finally, in a television application, the display can be active for hours or days at a time, so repositioning the image at display startup can be insufficient to prevent burn-in.

It can be advantageous, therefore, to reposition the image as often as possible without the movement becoming visible to the user. The location of the image can advantageously be changed after a frame of all-black data signals, or more generally after a frame that has a maximum data signal at or below a predetermined threshold. The predetermined threshold can be a data signal representing black. For example, during TV viewing, the image can be repositioned between two of the several black frames between commercials. The data signals for different color planes can have the same thresholds or different thresholds. For example, since the eye is more sensitive to green light than to red or blue, the threshold for green can be lower than the threshold for red or blue. In this case, the location of the image can be changed after a frame that has a maximum data signal in each color plane at or below the selected threshold for that color plane. That is, if a data signal in any color plane is above the selected threshold for that color plane, the location of the image can be left unchanged to avoid visible motion.

Additionally, the location of the image can be changed at least once per hour. The location of the image can be changed during fast motion scenes, which can be identified by image analysis as known in the art (e.g. motion estimation techniques). The times between successive changes of the image location can be different. Alternatively, the location of the image can be changed with other scene transitions. For instance, scene-change detection algorithms can be applied and the location can be changed within one or two frames of a scene change.

The invention has been described in detail with particular reference to certain preferred embodiments thereof, but it will be understood that variations and modifications can be effected within the spirit and scope of the invention.

PARTS LIST

20 EL display
21 source driver
23 gate driver
25 EL subpixel matrix
100 EL subpixel
105 EL drive circuit
110 first power supply line
111 first voltage source
120 data line
121*a* data line
121*b* data line
121*c* data line
121*d* data line
125 readout line
126*a* readout line
126*b* readout line
126*c* readout line
126*d* readout line
130 select line
131*a* select line
131*b* select line
131*c* select line
135*a* select line
135*b* select line
140*a* data line
140*b* data line
145 first electrode
150 second power supply line
151 second voltage source
155 second electrode
160 EL device
161*w* EL device
165 gate electrode
170 drive transistor
171*w* drive transistor
180 switch transistor
181*w* switch transistor
185 readout transistor
190 capacitor
195 electronics
200 electroluminescent pixel
205*b* subpixel
205*g* subpixel
205*r* subpixel
205*w* subpixel
210 first switch
215*w* intermediate node
220 second switch
225 control bus
230 switch block
235 data line
240 current source
245 current sink
250 readout transistor
255 readout transistor
260 voltage measurement circuit
265 low-pass filter
270 analog-to-digital converter
275 processor
280 memory
285 data input
290 digital-to-analog converter
295 multiplexer
310 electroluminescent (EL) display
320*b* pixel
320*g* pixel
320*r* pixel
320*w* pixel
330*w* subpixel
335*w* subpixel
410 block
415 block
420 block
425 block
430 block
435 block
440 block
445 block

450 block
455 decision block
460 block
465 decision block
470 block

The invention claimed is:

1. A method of compensating for changes in the characteristics of transistors and electroluminescent devices in an electroluminescent display, the method comprising:

providing an electroluminescent display comprising a two-dimensional array of subpixels arranged in rows and columns to form a plurality of pixels, each pixel comprising at least three subpixels of different colors, each subpixel in a pixel comprising an electroluminescent device and a drive transistor, each electroluminescent device being driven by the corresponding drive transistor in response to a drive signal;

providing in each pixel a readout circuit for one of the subpixels of a specific color comprising a first readout transistor and a second readout transistor connected in series;

using the readout circuit to derive a correction signal for the specific color subpixel based on the characteristics of at least one of the transistors in the specific color subpixel, or the electroluminescent device in the specific color subpixel, or both;

using the correction signal to adjust the drive signals applied to the drive transistor of the specific color subpixel and the drive transistors of subpixels of the specific color in one or more different pixels;

providing a respective first data line for each subpixel of the specific color in each pixel for providing the drive signals to the drive transistors to cause the electroluminescent devices to emit colored light;

providing a respective second data line for each subpixel of the specific color in each pixel for receiving readout signals;

providing a first voltage source and a first switch for selectively connecting the first voltage source to a respective first electrode of each drive transistor;

providing a second voltage source and a second switch for selectively connecting each electroluminescent device to the second voltage source; and providing a current source and a third switch for selectively connecting the current source to the second data line.

2. The method of claim 1, wherein each readout circuit provides a respective readout signal, and further comprising providing one or more data lines for providing the drive signals to the drive transistors to cause the electroluminescent devices to emit colored light, and for receiving readout signals and applying such readout signals to a compensation circuit.

3. The method of claim 1, further comprising providing for each row of subpixels a corresponding select line.

4. The method of claim 3, further comprising activating the readout circuit to derive the correction signal by simultaneously activating two select lines.

5. A method of compensating for changes in the characteristics of transistors and electroluminescent devices in an electroluminescent display, the method comprising:

providing an electroluminescent display comprising a two-dimensional array of subpixels arranged in rows and columns to form a plurality of pixels, each pixel comprising at least three subpixels of different colors, each subpixel in a pixel comprising an electroluminescent device and a drive transistor, wherein each electroluminescent device driven by the corresponding drive transistor in response to a drive signal to provide an image;

providing in each pixel a readout circuit for one of the subpixels of a specific color comprising a first readout transistor and a second readout transistor connected in series;

using the readout circuit to derive a correction signal for the specific color subpixel based on the characteristics of at least one of the transistors in the specific color subpixel, or the electroluminescent device in the specific color subpixel, or both, each readout circuit providing a respective readout signal;

using the correction signal to adjust the drive signals applied to the drive transistor of the specific color subpixel and the drive transistors of subpixels of the specific color in one or more different pixels;

changing the location of the image over time, providing a respective first data line for each subpixel of the specific color in each pixel for providing the drive signals to the drive transistors to cause the electroluminescent devices to emit colored light;

providing a respective second data line for each subpixel of the specific color in each pixel for receiving readout signals;

providing a first voltage source and a first switch for selectively connecting the first voltage source to a respective first electrode of each drive transistor;

providing a second voltage source and a second switch for selectively connecting each electroluminescent device to the second voltage source;

providing a current source and a third switch for selectively connecting the current source to the second data line;

providing a current sink and a fourth switch for selectively connecting the current sink to the second data line;

providing a test voltage source for applying a respective test potential to each first data line;

providing a voltage measurement circuit connected to each second data line;

testing the drive transistor of each subpixel of the specific color in each pixel by closing the first and fourth switches, opening the second and third switches, using the test voltage source to apply a test potential to each drive transistor through the respective first data line, activating the readout circuit, drawing a test current using the current sink, and using the voltage measurement circuit to measure the respective readout signals to provide the respective correction signals based on characteristics of the drive transistors; and testing the electroluminescent device of each subpixel of the specific color in each pixel by opening the first and fourth switches, and closing the second and third switches, activating the readout circuit, driving a test current using the current source, and using the voltage measurement circuit to measure the respective readout signals to provide the respective correction signals based on characteristics of the electroluminescent devices.

6. The method of claim 5, further comprising providing for each row of subpixels a corresponding select line.

7. The method of claim 6, further comprising activating the readout circuit to derive the correction signal by simultaneously activating two select lines.

8. The method of claim 5, wherein each readout circuit provides a respective readout signal, and further comprising:

providing one or more data lines for providing the drive signals to the drive transistors to cause the electroluminescent devices to emit colored light, and for receiving readout signals and applying such readout signals to a compensation circuit.

9. An electroluminescent pixel, comprising:

at least three subpixels of different colors, each subpixel comprising an electroluminescent device electrically connected at an intermediate node to a drive transistor, each electroluminescent device being driven by the corresponding drive transistor in response to a drive signal;

a readout circuit for one of the subpixels of a specific color comprising a first readout transistor and a second readout transistor connected in series, the first readout transistor being connected to the intermediate node of the specific color subpixel, and wherein the readout circuit provides at least one readout signal; and a first data line for providing a drive signal to the drive transistor of the specific color subpixel, and a second data line for receiving the readout signal and applying such readout signal to a compensation circuit, a first voltage source and a first switch for selectively connecting the first voltage source to a first electrode of the drive transistor of the subpixel of the specific color;

a second voltage source and a second switch for selectively connecting the electroluminescent device of the subpixel of the specific color to the second voltage source;

a current source and a third switch for selectively connecting the current source to the second data line; and a current sink and a fourth switch for selectively connecting the current sink to the second data line.

10. The electroluminescent pixel of claim 9, further including:

a test voltage source for applying a test potential to the first data line;

a voltage measurement circuit connected to the second data line; and a controller for driving the specific color subpixel to provide a first readout signal by activating the first and second readout transistors, closing the first switch and opening the second switch, closing the fourth switch and opening the third switch, applying a predetermined test potential to the first data line, and setting the current sink to draw a predetermined test current, and for driving the specific color subpixel to provide a second readout signal by activating the first and second readout transistors, opening the first switch and closing the second switch, opening the fourth switch and closing the third switch, and setting the current source to drive a predetermined test current.

11. The electroluminescent pixel of claim 9, wherein the at least three subpixels are arranged in at least two rows, and further including a corresponding select line for each row of subpixels.

12. The electroluminescent pixel of claim 11, wherein the gate of the first readout transistor is connected to a first select line and wherein the gate of the second readout transistor is connected to a second select line.

* * * * *